(12) United States Patent
Fritsch et al.

(10) Patent No.: US 9,431,096 B1
(45) Date of Patent: Aug. 30, 2016

(54) HIERARCHICAL NEGATIVE BITLINE BOOST WRITE ASSIST FOR SRAM MEMORY DEVICES

(71) Applicant: International Business Machines Corporation, Armonk, NY (US)

(72) Inventors: Alexander Fritsch, Esslingen (DE); Werner Juchmes, Boeblingen (DE); Michael B. Kugel, Boeblingen (DE); Rolf Sautter, Bondorf (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/943,026

(22) Filed: Nov. 17, 2015

(51) Int. Cl.
*G11C 8/00* (2006.01)
*G11C 11/418* (2006.01)
*G11C 11/419* (2006.01)
*G11C 15/04* (2006.01)
*G11C 8/12* (2006.01)

(52) U.S. Cl.
CPC ............ *G11C 11/418* (2013.01); *G11C 11/419* (2013.01); *G11C 15/04* (2013.01); *G11C 8/12* (2013.01)

(58) Field of Classification Search
CPC ... G11C 11/418; G11C 11/419; G11C 15/04; G11C 8/12; G11C 7/18
USPC .................. 365/230.03, 230.06, 230.08, 231; 711/2, 211
See application file for complete search history.

(56) References Cited

U.S. PATENT DOCUMENTS

| | | | |
|---|---|---|---|
| 5,675,529 A * | 10/1997 | Poole .................... | G11C 11/419 365/149 |
| 8,233,342 B2 | 7/2012 | Adams et al. | |
| 8,441,874 B2 | 5/2013 | Sinha et al. | |
| 8,958,238 B2 * | 2/2015 | Sharma ......................... | 365/156 |
| 8,971,097 B2 | 3/2015 | Ngo et al. | |
| 2002/0196669 A1 * | 12/2002 | Hsu ....................... | G11C 7/1042 365/189.04 |
| 2003/0058688 A1 * | 3/2003 | Nguyen ................. | G11C 16/08 365/185.11 |
| 2004/0008564 A1 * | 1/2004 | Tsuda ....................... | G11C 8/12 365/230.03 |
| 2005/0125591 A1 * | 6/2005 | Fujimoto ............. | G11C 7/1078 711/1 |
| 2005/0281080 A1 * | 12/2005 | Dray ........................ | G11C 7/12 365/171 |
| 2006/0002181 A1 * | 1/2006 | Frey ........................ | G11C 11/16 365/158 |

(Continued)

OTHER PUBLICATIONS

Zimmer, Brian, et al., "SRAM Assist Techniques for Operation in a Wide Voltage Range in 28-NM CMOS", IEEE Dec. 2012, p. 857, <http://www.eecs.berkeley.edu/~krste/papers/zimmer-ieeetcas11-2012.pdf>.

(Continued)

*Primary Examiner* — Viet Q Nguyen
(74) *Attorney, Agent, or Firm* — Kevin Kehe

(57) ABSTRACT

A memory device having a plurality of banks of memory cells may be provided. Each memory cells may be interconnected via a local write bit-line and a complementary local write bit-line to a local write bit-line buffer circuit. The local write bit-line buffer circuit may be connected via a global write bit-line and a complementary one to a negative bias write assist circuit. The memory device may also comprise an address decoder separately connected to the local write bit-line buffer circuits. The address decoder may comprise a generating unit for enabling exactly one local write enable signal for a respective one of said local write bit-line buffer circuits. The local write bit-line buffer circuit may be adapted for generating local write data on said local write bit-line in response to receiving global write data on said global write bit-line when its local write enable signal is enabled.

13 Claims, 4 Drawing Sheets

(56) References Cited

U.S. PATENT DOCUMENTS

| | | | |
|---|---|---|---|
| 2007/0081379 A1 | 4/2007 | Clinton et al. | |
| 2008/0130383 A1* | 6/2008 | Kushida | G11C 11/413 365/191 |
| 2008/0151653 A1* | 6/2008 | Ishikura | G11C 7/065 365/189.15 |
| 2010/0329053 A1* | 12/2010 | Park | G11C 29/808 365/200 |
| 2010/0329057 A1* | 12/2010 | Lee | G11C 7/12 365/203 |
| 2013/0077387 A1 | 3/2013 | Yabuuchi | |
| 2013/0286717 A1 | 10/2013 | Adams et al. | |
| 2014/0032835 A1* | 1/2014 | Hsu | G11C 8/16 711/114 |
| 2014/0071737 A1* | 3/2014 | Sharma | G11C 11/419 365/156 |
| 2014/0169106 A1 | 6/2014 | Kolar et al. | |
| 2014/0254293 A1* | 9/2014 | Desai | G11C 7/1096 365/189.16 |
| 2015/0138863 A1 | 5/2015 | Roy et al. | |
| 2015/0138876 A1 | 5/2015 | Roy et al. | |
| 2015/0179232 A1 | 6/2015 | Felix et al. | |

OTHER PUBLICATIONS

Sharma, Rajpal, et al., "Reliability Aware Negative Bit-Line Voltage Write Assist Scheme for SRAM", International Journal of Advanced Research in Computer Science and Software Engineering, Aug 2013, <http://www.ijarcsse.com/docs/papers/Volume_3/8_August2013/V3I8-0284.pdf>.

* cited by examiner

HIERARCHICAL NEGATIVE BITLINE BOOST WRITE ASSIST FOR SRAM MEMORY DEVICES

BACKGROUND

The invention relates generally to memory devices, and more specifically, to a memory device having a plurality of banks, each bank comprising a plurality of memory cells. The invention relates further to a related design structure.

Wide memory arrays of SRAM cells with long word lines in upcoming 14 nm semiconductor production technologies typically use a write assist circuit to ensure cell write-ability. This technology uses a single reduced voltage for the array. Additionally, the cells may be pretty stable due to the transistor characteristics (fully depleted FIN-FETs). The tuning options may be limited. Furthermore it is not possible to build half FINs, i.e., the gate-width may only be varied in discrete steps and doping is more and difficult to control. This may cause that safe write operations for memory cells may be critical. Therefore, the bit-lines use a negative voltage pulse to assist and thus, improve/ensure cell write-ability.

The electrical behavior of a bit-line is dominated by its capacitance. To drive the bit-line below ground, a boost capacitor may be required. The state-of-the-art NBA (negative bias write assist) circuitry requires a boost capacitor, that has to scale with the total bit-line capacitance and therefore with the number of data words a memory can store. For large arrays, the state-of-the-art NBA consumes a significant amount of area and power.

SUMMARY

According to one aspect of the present invention, a memory device having a plurality of banks may be provided. Each bank may comprise a plurality of memory cells, each of which being interconnected via a local write bit-line and a complementary local write bit-line to a respective local write bit-line buffer circuit. The local write bit-line buffer circuit may be connected via a global write bit-line and a complementary global write bit-line to a negative bias write assist circuit.

The memory device may also comprise an address decoder separately connected to each of the respective local write bit-line buffer circuits by a plurality of respective local write enable signal lines. The address decoder may comprise a generating unit for enabling exactly one local write enable signal for a respective one of the local write bit-line buffer circuits when a write address vector specifies a write operation to one of memory cells in a corresponding one of the banks.

The local write bit-line buffer circuit may be adapted for generating local write data on the local write bit-line and the complementary local write bit-line in response to receiving global write data on the global write bit-line and the complementary global write bit-line when its local write enable signal is enabled.

The above summary is not intended to describe each illustrated embodiment or every implementation of the present disclosure.

BRIEF DESCRIPTION OF THE SEVERAL VIEWS OF THE DRAWINGS

It should be noted that embodiments of the invention are described with reference to different subject-matters. In particular, some embodiments may be described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, but to which the invention is not limited.

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
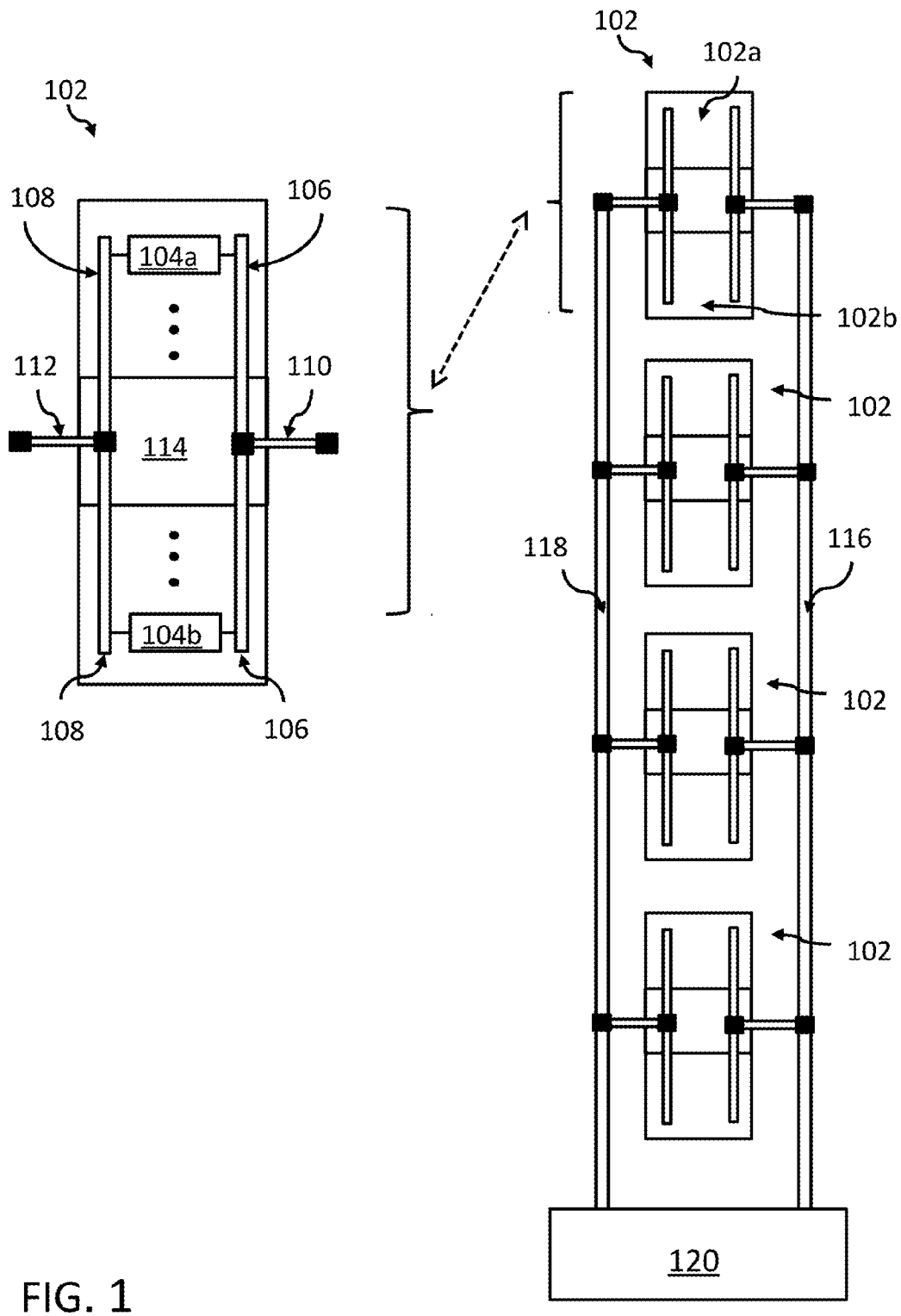

Preferred embodiments of the invention will be described, by way of example only, and with reference to the following drawings:

FIG. 1 shows an overview block diagram of a global write bit-line topology using also a complementary global write bit-line.

Figure 2:
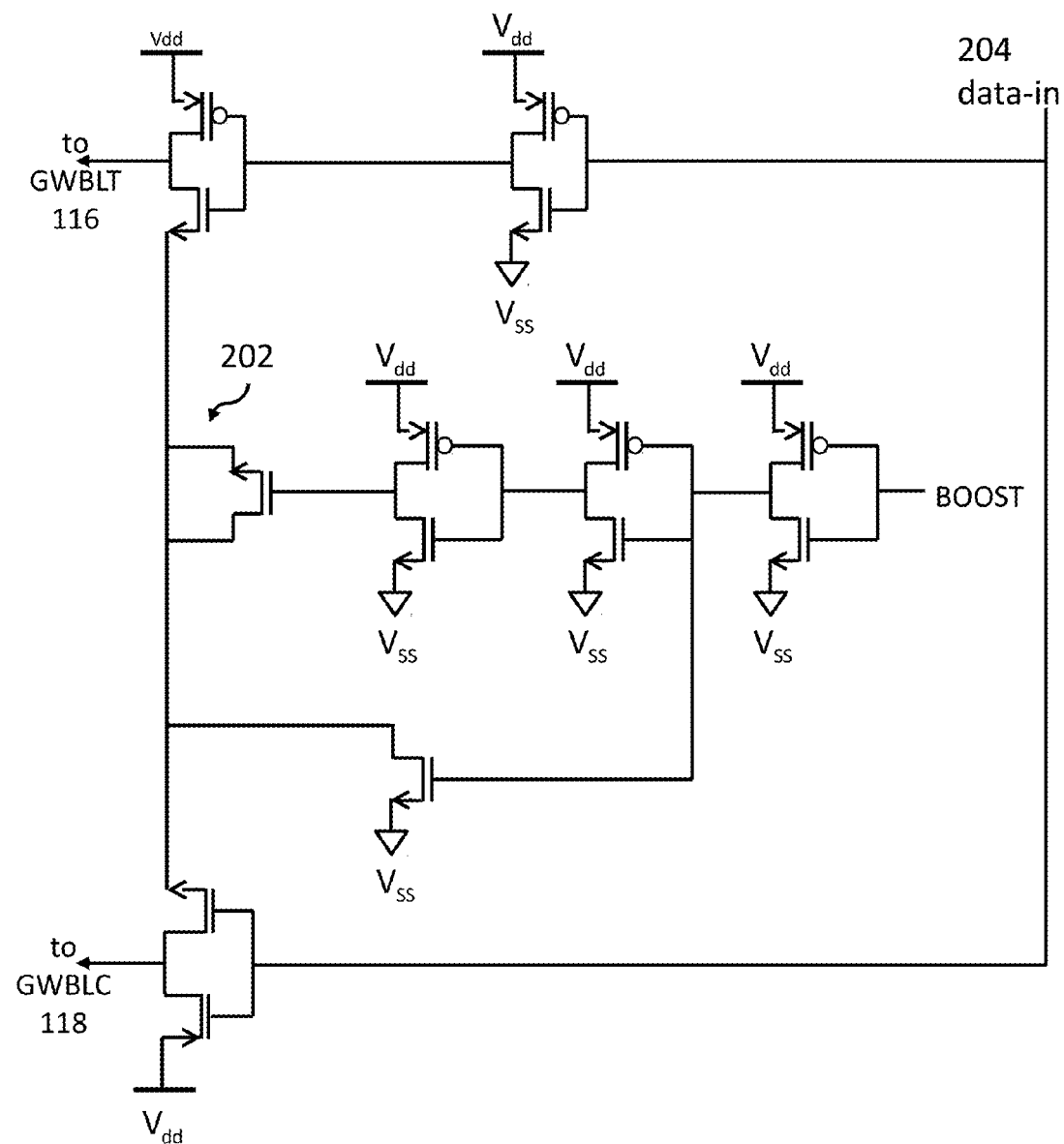

FIG. 2 shows a block diagram of an embodiment of a negative bit-line assist boost circuitry.

Figure 3A:
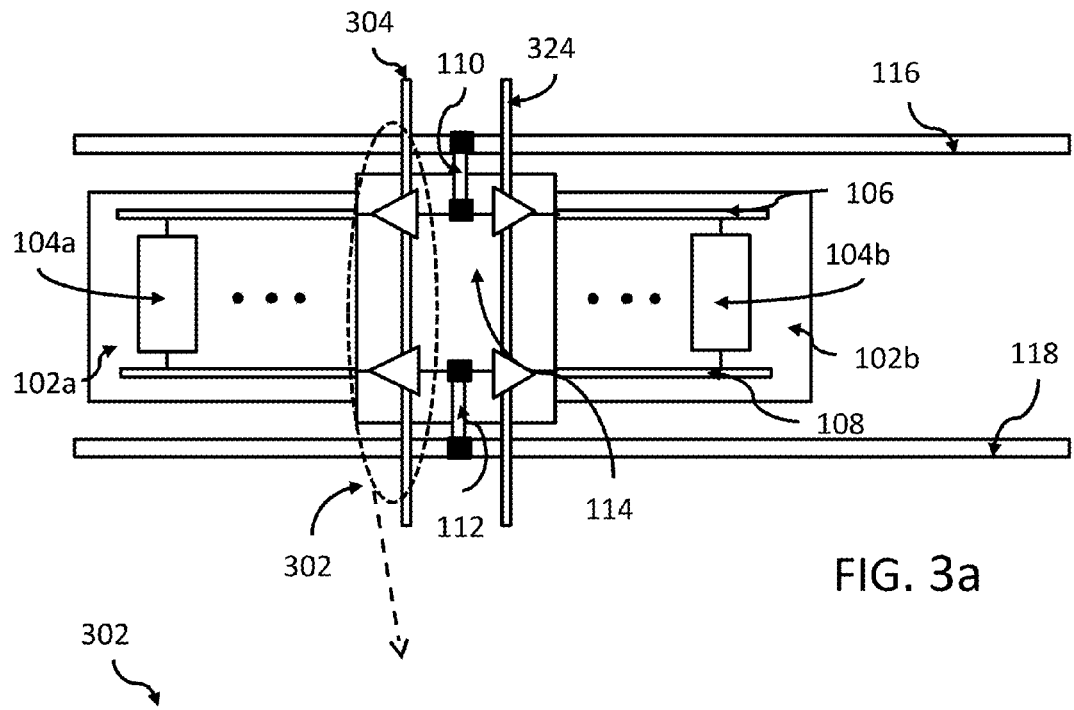
Figure 3B:
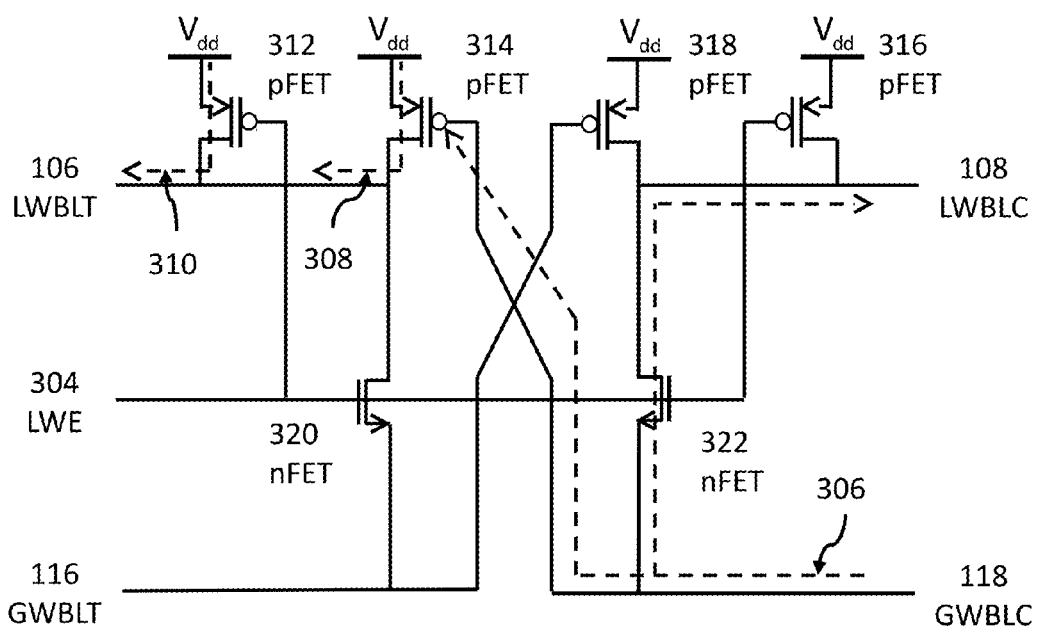

FIG. 3a, 3b show block diagrams of the split local write bit-line approach using the local write bit-line buffer circuit.

Figure 4:
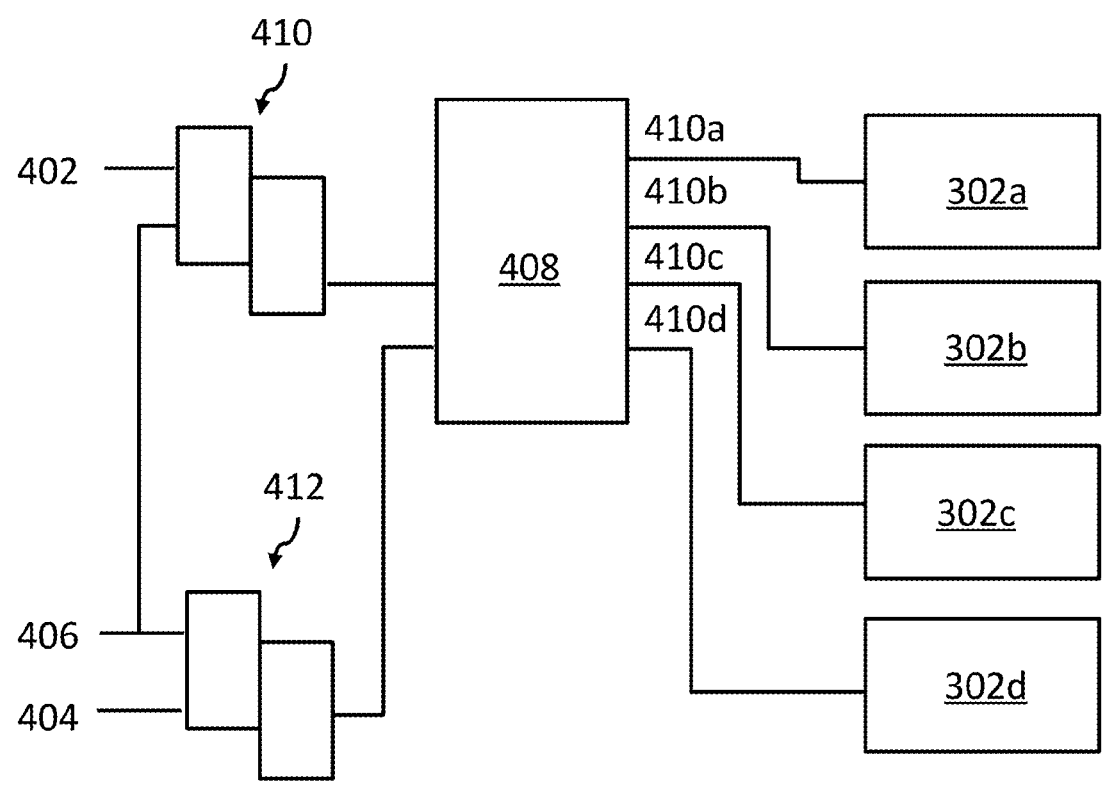

FIG. 4 shows a diagram of an embodiment of the address decoder connected to a plurality of local write bit-line buffer circuit.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

According to one aspect of the present invention, a memory device having a plurality of banks may be provided. Each bank may comprise a plurality of memory cells, each of which being interconnected via a local write bit-line and a complementary local write bit-line to a respective local write bit-line buffer circuit. The local write bit-line buffer circuit may be connected via a global write bit-line and a complementary global write bit-line to a negative bias write assist circuit.

The memory device may also comprise an address decoder separately connected to each of the respective local write bit-line buffer circuits by a plurality of respective local write enable signal lines. The address decoder may comprise a generating unit for enabling exactly one local write enable signal for a respective one of the local write bit-line buffer circuits when a write address vector specifies a write operation to one of memory cells in a corresponding one of the banks.

The local write bit-line buffer circuit may be adapted for generating local write data on the local write bit-line and the complementary local write bit-line in response to receiving global write data on the global write bit-line and the complementary global write bit-line when its local write enable signal is enabled.

According to another aspect of the present invention, a design structure tangible embodied in a machine-readable storage medium used in a design process of a memory device may be provided. The design structure may have elements then, when processed in a semiconductor manufacturing facility, may produce a memory device having a plurality of banks. Each bank may comprise a plurality of memory cells, each of which being interconnected via a local write bit-line and a complementary local write bit-line to a respective local write bit-line buffer circuit. The local write bit-line buffer circuit may be connected via a global write bit-line and a complementary global write bit-line to a negative bias write assist circuit.

Additional, more specific details have already been described above in the context of the related memory device.

It may be noted that the memory cells connected to the local write bit-line buffer circuit may be connected with 2 sets of local write bit-lines/complementary local write bit-lines, respectively. In one embodiment, the first (left) part of the local write bit-line and a second (right) part of the local write bit-line may be identical in length, i.e., having an equal number of memory cells connected to then. In such a configuration, the local write bit-line buffer circuit may be split in half: a first half and a second half.

The proposed memory device having a plurality of banks, each bank comprising a plurality of memory cells and the related design structure may offer a couple of advantages and technical effects:

The inventive concept is based on a structure applying global write bit-lines (GWBL) and complementary global bit-lines (GWBLC) as well as local write bit-lines (LWBL) and complementary local write bit-lines (LWBLC). The NBA's capacitance circuitry may be reduced due to a usage of one or more local write bit-line buffer circuits, which may enable only one LWBL, in particular, the one which is needed for an execution to a write command to a specific memory cell.

Each set of local write bit-lines may be connected to global write bit-lines/complementary global write bit-line, respectively, by the proposed local write bit-line buffer circuit that may be enabled and disabled by a write bank select signal (also: "local write enable line", see below). If enabled, the local write bit-line buffer circuit actively buffers logical '1' voltage levels while negative voltages are passively forwarded from the global write bit-lines to the local write bit-lines. If disabled, it may effectively decouple a local write bit-line from a global write bit-line. No negative supply voltage may be required for the local write bit-line buffer circuit.

A write bank select signal may be generated in the write address decoder such that only one—i.e., exactly one—memory bank may be enabled for a write operation at a time. Consequently, only one set of local write bit-lines—i.e., one local write bit-line and a corresponding complementary local write bit-line—may be connected to the set of global write bit-lines—i.e., global write bit-line and a corresponding complementary global write bit-line. The effective write bit-line capacitance may be significantly reduced. Since the NBA device sizes scale with the write bit-line capacitance, the NBA boost capacitance and driver circuits may be reduced by the same percentage, which may saves a significant amount of "silicon area" and may reduce the write power consumption as well as the current surge generation at constant write-ability. The negative boost signal of the NBA may be passed unchanged to the enabled local write bit-line/complementary local write bit-line.

This inventive concept may also be used for increasing the number of memory cells connected to each of the local write bit-lines. Furthermore, the inventive concept may advantageously be used for SRAM cells as well as for CAM (content-addressable memory) cells and, in particular, for TCAM cells (ternary CAM).

In the following, additional embodiments of the memory device will be described.

According to one preferred embodiment of the memory device, at least one address buffer may be connected between the address decoder and one or more of respective lines of the write address vector specifying the write operation to the one or more memory cells in the corresponding bank. This may guarantee a stable input signal usable by the address decoder. However, the inventive concept may also work without these address buffers. Thus, any form of address buffer, e.g., latches, may be used as long as a stable, non-delayed signal may be provided to the address decoder.

According to a further preferred embodiment of the memory device, the generating unit may be a static local write enable decoder adapted for receiving output signals from at least one address buffer. This decoder may be instrumental in generating the local write enable signal for one of the local write bit-line buffer circuits. Thus, only exactly one of the local write bit-lines and corresponding complementary local write bit-lines may be enabled to write data in a memory cell. All other local write bit-lines as well as all other corresponding complementary local write bit-lines related to the global write bit-line/the complementary global write bit-line, respectively, may be disabled.

With other words and according to one embodiment, the generating unit may be adapted for generating local write enable signals, each of which to be receivable by one of a plurality of the local write bit-line buffer circuits. However, the selection/enablement of one of the respective local write bit-line buffer circuits may be mutually exclusive. Consequently, only one of the local write bit-lines—as well as the corresponding complementary local write bit-lines—may be connected to the corresponding global write bit-line/complementary global write bit-line, respectively.

According to one advantageous embodiment of the memory device, the local write bit-line buffer circuit may comprise a symmetrical arrangement of four pFETs and two nFETs arranged such that one local write bit-line is enabled while all other local write bit-lines of all other banks of the memory device are disabled. More specifically, each of the local write bit-line buffer circuits may comprise a first pFET (PWET) connected with its drain to the local write bit-line, with its source to Vdd, and with its gate to the local write enable signal.

The local write bit-line buffer circuit may also comprise a second pFET (PLWBLT) connected with its drain to the local write bit-line, with its source to Vdd, and with its gate to the complementary global write bit-line. Furthermore, the local write bit-line buffer circuit may comprise a first nFET (NWET) connected with its gate to the local bit-line enable signal, with its drain to the local write bit-line, and with its source to the global write bit-line.

In a further enhanced embodiment of the memory device, the local write bit-line buffer circuit may also comprise a third pFET (PWEC) connected with its drain to the complementary local write bit-line, with its source to Vdd, and with its gate to the local write enable signal, and a fourth pFET (PLWBLT) connected with its drain to the complementary local write bit-line, with its source to Vdd, and with its gate to the global write bit-line. Furthermore, the local write bit-line buffer circuits may comprise a second nFET (NWEC) connected with its gate to the local bit-line enable signal, with its drain to the local complementary write bit-line, and with its source to the complementary global write bit-line.

These 6 FETs operate together with the static local write enable decoder ensuring that only one local write bit-line—i.e., and a corresponding complementary local write bit-line—of a bank of the memory device may be connected to the global write bit-line and the complementary global write bit-line. At the same time, the negative swing from the NBA may be passed to the local write bit-lines when required.

In the context of this description, the following conventions, terms and/or expressions may be used:

The term 'memory cell' may denote a structure designed for storing one bit of information. This may apply to SRAM (static random access memory) cells as well as to binary CAM (content addressable memory) cells. In case of a TCAM (ternary CAM) cell a third matching state may be allowable referring to "don't care".

The term 'SRAM cell' may denote a type of semiconductor memory that uses bi-stable latching circuitry (flip-flop) to store one bit of information.

The term 'memory device' may denote here a plurality of memory cells—e.g., SRAM cells—organized in regular blocks or banks of, e.g., 64 SRAM cells. Each block may be split in half such that each half block may comprise 32 SRAM cells. Instead of the SRAM cells also TCAM cells may be possible. Of course other numbers of memory cells are possible, e.g., 32/16 or 128/64 cells per block/half block. Also asymmetrical splits of "halves"—i.e., a first part and a second part which may not be identical in size—may be possible, as well as a number of memory cells that are not equivalent to the power of 2.

The term 'address decoder' may denote a decoder which may generate, e.g., 4 mutually exclusive local write enable signals out of two address bits of an address vector. The address decoder may be implemented in form of a static local write enable decoder. If the address vector may be longer than 2 bits, the address decoder may generate more write enable signals equivalent to the number of bits in the address vector, i.e., 8 write enable signals for 3 bits of the address vector, 16 write enable signals for 4 bits of the address vector, and so on.

The term 'complementary global write bit-line' may denote another type of global write bit-line having generally a reversal signal if compared to the corresponding global write bit-line. If the local write enable signal equals "Zero"—thus, non-selected—the local write bit-lines as well as the complementary local write bit-lines may be disconnected from the global write bit-line and the complementary global write bit-line, respectively. Thus, the local write bit-lines and the complementary local write bit-lines are pulled to Vdd (via the pFETs 312, 316—see also FIG. 3b).

The term 'local write bit-line buffer circuit' may denote a circuitry as denoted by FIG. 3b and described below. It may disconnect the local write bit-line as well as the complementary local write bit-line from the global write bit line and the complementary global write bit-line, respectively, if the local write bit-line buffer circuit may not be activated by a local write enable signal.

In the following, a detailed description of the figures will be given. All instructions in the figures are schematic. Firstly, a block diagram of the general structure of a global write bit-line connected to local write bit-lines with memory cells, as well as a related NBA circuitry is described. Afterwards, embodiments of the inventive local write bit-line buffer circuit and a corresponding address decoder will be described.

FIG. 1 shows an overview block diagram of a global write bit-line topology. It may be noted that only some of those components are shown which are required for writing into memory cells. Parallel circuitry for reading information from the memory cells is not shown in the following diagrams. FIG. 1 shows four banks 102 of memory cells. Each bank may be subdivided into a left or first part 102a and a right or second part 102b. In one embodiment, each part of the bank 102 may comprise an equal number of memory cells, e.g., 32 SRAM cells. However, another number of SRAM cells are possible, also an uneven number of memory cells or not the same number of memory cells in the first and the second part. The first bank 102 may be expanded on the top left side of FIG. 1 showing more details. As an example, only one SRAM cell 104a, 104b is shown as a representative for other memory cells in each part of the bank 102.

The memory cells are connected between a local write bit-line 106 (LWBL) and a complementarity local write bit-line 108 (LWBLC). Each part of the local write bit-line 106 and the complementary local write bit-line 108 are each connected—for the first partial bank and for the second partial bank, respectively—to a local evaluation circuit 114. It may be noted that the local write bit-line 106 may also be called local write bit-line "true" (LWBLT) in the complementary way to the complementary local write bit-line 108 (LWBLC).

From the local evaluation circuitry 114, both parts of the local write bit-line 106 and the complementarity local write bit-line 108 are connected via bridges 110, 112 to a global write bit-line 116 (GWBL or GWBLT for global write bit-line "true" in contrast to the complementary global write bit-line GWBLC) and a complementary global write bit-line 118 (GWBLC). The global write bit-line negative boost assist circuitry 120 is shown at the bottom of FIG. 1. It may ensure that write operations to the memory cells SRAM 104a, 104b may be performed in a safe manner. A skilled person may know that the more banks 102 may be connected to the global write bit-line 116 and the complementary global write bit-line 118—and thus more SRAM memory cells 104a, 104b—the more charge is required on the respective lines for a guaranteed, correct write operation. This may become a disadvantage in terms of required power and speed during write operations, especially if the device structures are getting smaller and smaller, e.g., in the upcoming 14 nm processes.

For completeness reasons, an example of a global write bit-line negative boost assist circuitry 120 is shown in FIG. 2. The details may be known to a skilled person. However, it may only be noted that the nFET 202 may not be used as a transistor but as a capacitor. The capacitance of this capacitor may become one of the bottlenecks for charging the global write bit-line 116 and the complementary global write bit-line (GWBLC connection) as well as the local write-bit lines 106 and their complementary local write bit-lines 108 with enough charge for a safe operation—i.e., write operations of the SRAM cells 104a, 104b. The connector 204 is used for a data-in, i.e., the data bit to be written to a specific memory cell 104.

FIG. 3a shows a more detailed view of a portion of a local evaluation circuitry 114 with a local write bit-line buffer circuit for write operations. It may again be noted that circuitry required for read operations are not shown. As can be seen, the first part 102a and the second part 102b of the bank 102 of SRAM cells are separated by a local write bit-line buffer circuit 302—and circulated by a dashed line. The local write bit-line buffer circuits 302—i.e., the left and the right local write bit-line buffer circuit—are connected by the bridges 110, 112 to the global write bit-line 116 and the complementarity global write bit-line 118. Additionally, the local write bit-line buffer circuit 302—i.e., left and right—is each connected to a local write enable lines 304, 324.

For the right block 102b of SRAM cells 104b, an equivalent local write bit-line buffer circuitry is shown. Thus, the left block 102a and the right block 102b are designed symmetrically, in particular each half with its own local write bit-line buffer circuit.

FIG. 3b shows details of the local write bit-line buffer circuit 302 and how it may be connected to the local write bit-line 106, the local write enable line 304, the global write bit-line 116, the complementary local write bit-line 108, and the complementary global write bit-line 118. Four pFETs 312, 314, 316, 318 and two nFETs 320, 322 are used and interconnected as shown. The dashed lines 306, 308, 310 are indicative of signal flows when different one of the lines are activated.

As a consequence, only one bank of all memory banks 102 connected to the global write bit-line 116 and the complementarity global write bit-line 118 may be activated at one point in time and thus, reducing the capacity required on each of these line for a safe write operation. The local write enable lines 304, 324 may be "1-hot" and may be generated by an address decoder (compare FIG. 4) in order to differentiate between the local write enable line 304 and the local write enable line 324 for the first and the second part of right part of the block 102. This may ensure that the low level and the negative bit-line swing of the NBA are propagated by the nFETs 320, 322 pass-gates. A high level is actively driven onto the local write bit-lines 106 by the pass-gate pFETs 314 and 318. The clock gated local write bit-lines 106 are put up by small pFET keeper devices 312 and 316.

The dashed line 308 indicates—as an example—that the local write bit-lines 106 and the complementary local write bit-lines 108 are pulled up through pFET devices 314 and 318 (PLWBLT/PLWBLC), which are controlled by the opposite global write bit-line—complementarity global write bit-line 118 and global write bit-line 116, respectively—if activated.

On the other side—as indicated by the dashed line 310—the local write bit-line 106 and the complementary local write bit-line 108 are pulled up through the pFET devices 312, 316 (PWET/PWEC) which are controlled by the local write enable line 304 if clock-gated.

Additionally, the dashed line 306 may indicate that the negative swing of the NBA 120 is passed to the complementary local write bit-line 108 through the nFET pass-gate devices 322 (NWEC), while at the same time pFET 314 opens and pulls the local write bit-line 106 to VDD (dashed line 308).

This way, enabled through the novel split local write bit-line buffer approach, the required charge on the global write bit-line 116 or the complementary global write bit-line 118 as well as the capacity of the transistor 202 of the NBA 120, may be reduced significantly while still enabling secure write operations to the selected memory cells.

It may be noted that the proposed approach may be used for, e.g., eight transistor SRAM cells, as well as for TCAM cells. It may be noted that the additional circuitry required for the local write bit-line buffer circuitry 302 may—at least in parts—be compensated by less space required for the NBA circuit 120. Additionally, a significant amount of power may be saved because only one bank of all bank 102 require the charge of the global write bit-line 116 and/or the complementary global write bit-line 118. Thus, the negative impact of a large NBA circuit 120 which may generate large AC currents, which may be multiplied by the number of data bits—i.e., e.g., SRAM cells—and thus, representing a huge multiplier, especially for wide, write intensive memory arrays, may be overcome.

In order to separately address the local write bit-line 106 and the complementary local write bit-line 108 according to the split of the banks 102, also the local write enable signals need to be split. This is shown in FIG. 4. As an example, a static local write enable decoder 408 receives the two MSBs, 402 and 403 (most significant bit), 404 of a write address vector via the address buffers 410, 412. As additional input the clock signal 406 is shown as input signal. In case of these two write address signals 402 and 404, the static local write enable decoder 408 may need to generate 4 local write enable signals 410a, 410b, 410c, 410d for four local write bit-line buffer circuits 302a, 302b, 302c, 302d for four banks 102.

Hence, one local write enable signal is derived from the write address vector such that one local write bit-line buffer circuitry 302 drives one bank 102. Consequently, for four write banks—each representing one bank of memory cells 102—two write address bits are decoded.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or another devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A memory device having a plurality of banks, each bank comprising a plurality of memory cells, each of which being interconnected via a local write bit-line and a complementary local write bit-line to a respective local write bit-line buffer circuit,
   wherein said local write bit-line buffer circuit is connected via a global write bit-line and a complementary global write bit-line to a negative bias write assist circuit,
   the memory device also comprising:
   an address decoder separately connected to each of said respective local write bit-line buffer circuits by a plurality of respective local write enable signal lines, said address decoder comprising a generating unit for enabling exactly one local write enable signal for a respective one of said local write bit-line buffer circuits when a write address vector specifies a write operation to one of memory cells in a corresponding one of said banks,
   wherein said local write bit-line buffer circuit is adapted for generating local write data on said local write bit-line and said complementary local write bit-line in response to receiving global write data on said global write bit-line and said complementary global write bit-line when its local write enable signal is enabled.

2. The memory device according to claim 1, wherein at least one address buffer is connected between said address decoder and one or more of respective lines of said write address vector specifying said write operation to said one or more memory cells in said corresponding bank.

3. The memory device according to claim 2, wherein said generating unit is a static local write enable decoder adapted for receiving output signals from said at least one address buffer.

4. The memory device according to claim 1, wherein said generating unit is adapted for generating local write enable signals to be receivable by a plurality of said local write bit-line buffer circuits each.

5. The memory device according to claim 1, wherein said local write bit-line buffer circuit comprises a symmetrical arrangement of four pFETs and two nFETs arranged such that one local write bit-line is enabled while all other local write bit-lines of all other banks are disabled.

6. The memory device according to claim 1, wherein each of said local write bit-line buffer circuits comprises:
   a first pFET connected
      with its drain to said local write bit-line,
      with its source to Vdd, and
      with its gate to said local write enable signal,
   a second pFET connected
      with its drain to said local write bit-line,
      with its source to Vdd, and
      with its gate to said complementary global write bit-line, and
   a first nFET connected
      with its gate to said local bit-line enable signal,
      with its drain to said local write bit-line, and
      with its source to said global write bit-line.

7. The memory device according to claim 6, wherein each of said local write bit-line buffer circuits also comprises:
   a third pFET connected
      with its drain to said complementary local write bit-line,
      with its source to Vdd, and
      with its gate to said local write enable signal,
   a fourth pFET connected
      with its drain to said complementary local write bit-line,
      with its source to Vdd, and
      with its gate to said global write bit-line, and
   a second nFET connected
      with its gate to said local bit-line enable signal,
      with its drain to said local complementary write bit-line, and
      with its source to said complementary global write bit-line.

8. The memory device according to claim 1, wherein each of said memory cells is a static random access memory cell.

9. The memory device according to claim 1, wherein each of said memory cells is a content addressable memory cell.

10. The memory device according to claim 1, wherein each of said memory cells is ternary content addressable memory cell.

11. A design structure tangible embodied in a machine-readable storage medium used in a design process of a memory device, said design structure having elements then, when processed in a semiconductor manufacturing facility, produce a memory device having a plurality of banks, each bank comprising a plurality of memory cells, each of which being interconnected via a local write bit-line and a complementary local write bit-line to a respective local write bit-line buffer circuit, wherein said local write bit-line buffer circuit is connected via a global write bit-line and a complementary global write bit-line to a negative bias write assist circuit,
   wherein said memory device also comprises:
   an address decoder separately connected to each of said respective local write bit-line buffer circuit by a plurality of respective local write enable signal lines, said address decoder comprising a generating unit for enabling exactly one local write enable signal for a respective one of said local write bit-line buffer circuits when a write address vector specifies a write operation to one of memory cells in a corresponding one of said banks,
   wherein said local write bit-line buffer circuit is adapted for generating local write data on said local write bit-line and said complementary local write bit-line in response to receiving global write data on said global write bit-line and said complementary global write bit-line when its local write enable signal is enabled.

12. The design structure according to claim 11, wherein the design structure comprises a net-list which describes said memory device.

13. The design structure according to claim 11, wherein the design structure includes at least one set of test data, characterization data, verification data, or design specification.

* * * * *